United States Patent
Zhu et al.

(10) Patent No.: US 9,018,739 B2
(45) Date of Patent: Apr. 28, 2015

(54) SEMICONDUCTOR DEVICE AND METHOD OF FABRICATING THE SAME

(75) Inventors: Huilong Zhu, Poughkeepsie, NY (US); Qingqing Liang, Beijing (CN); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 1100 days.

(21) Appl. No.: 13/060,468

(22) PCT Filed: Sep. 25, 2010

(86) PCT No.: PCT/CN2010/001482
§ 371 (c)(1),
(2), (4) Date: Feb. 24, 2011

(87) PCT Pub. No.: WO2011/127634
PCT Pub. Date: Oct. 20, 2011

(65) Prior Publication Data
US 2011/0303951 A1 Dec. 15, 2011

(30) Foreign Application Priority Data
Apr. 14, 2010 (CN) .......................... 2010 1 0147601

(51) Int. Cl.
*H01L 29/04* (2006.01)
*H01L 29/78* (2006.01)
(Continued)

(52) U.S. Cl.
CPC .......... *H01L 29/7834* (2013.01); *H01L 29/045* (2013.01); *H01L 29/105* (2013.01); *H01L 29/1054* (2013.01); *H01L 29/1083* (2013.01); *H01L 29/165* (2013.01); *H01L 29/495* (2013.01); *H01L 29/4966* (2013.01); *H01L 29/517* (2013.01); *H01L 29/665* (2013.01);
(Continued)

(58) Field of Classification Search
USPC .......... 257/401, 618, 619, 627, 628, E29.267, 257/E29.276, E29.299
See application file for complete search history.

(56) References Cited

U.S. PATENT DOCUMENTS 7,335,545 B2 * 2/2008 Currie .......................... 438/197
7,560,758 B2 7/2009 Zhu et al.
(Continued)

FOREIGN PATENT DOCUMENTS

CN 1832142 A 9/2006
CN 101097955 A 1/2008

OTHER PUBLICATIONS

Official Search Report and Written Opinion of the Chinese Patent Cooperation Treaty Office, in counterpart Application No. PCT/CN2010/001482, filed Sep. 25, 2010.

*Primary Examiner* — Matthew E Warren
(74) *Attorney, Agent, or Firm* — Kinney & Lange, P.A.

(57) ABSTRACT

The present application discloses a semiconductor device and a method for manufacturing the same. The semiconductor device comprises a semiconductor substrate; a first semiconductor layer on the semiconductor substrate; a second semiconductor layer surrounding the first semiconductor layer; a high k dielectric layer and a gate conductor formed on the first semiconductor layer; source/drain regions formed in the second semiconductor layer, wherein the second semiconductor layer has a slant sidewall in contact with the first semiconductor layer. The semiconductor device has an increased output current, an increased operating speed, and a reduced power consumption due to the channel region of high mobility.

9 Claims, 8 Drawing Sheets

(51) Int. Cl.
  *H01L 29/10* (2006.01)
  *H01L 29/165* (2006.01)
  *H01L 29/49* (2006.01)
  *H01L 29/51* (2006.01)
  *H01L 29/66* (2006.01)

(52) U.S. Cl.
  CPC ...... *H01L 29/6653* (2013.01); *H01L 29/66545* (2013.01); *H01L 29/6659* (2013.01); *H01L 29/66636* (2013.01); *H01L 29/66651* (2013.01)

(56) References Cited

U.S. PATENT DOCUMENTS

| | | |
|---|---|---|
| 2003/0162358 A1 | 8/2003 | Hanafi et al. |
| 2005/0090066 A1 | 4/2005 | Zhu et al. |
| 2006/0199326 A1 | 9/2006 | Zhu et al. |
| 2008/0142840 A1* | 6/2008 | Lindert et al. ............... 257/190 |
| 2008/0311720 A1* | 12/2008 | Hoffman et al. ............... 438/300 |
| 2009/0302412 A1 | 12/2009 | Cheng et al. |

* cited by examiner

SEMICONDUCTOR DEVICE AND METHOD OF FABRICATING THE SAME

BACKGROUND OF THE INVENTION

1. Field of Invention

The present invention relates generally to a semiconductor device and a method for manufacturing the same, and more particularly, to an MOSFET (metal oxide semiconductor field effect transistor) structure with a channel region of high mobility and a method for manufacturing the same.

2. Description of Prior Art

One trend of the integrated circuit technology is to integrate as many MOSFETs as possible in a unit area of a chip. With scaling down of the MOSFET dimensions, a gate length is reduced to less than 32 nm. However, due to the reduced gate length, the gate has a poor controllability on a channel region, which degrades properties of the MOSFET, especially causes a short channel effect in which a threshold voltage of the MOSFET decreases. Moreover, a poor conductivity of polysilicon causes a voltage drop across a polysilicon gate when a voltage is applied to the gate. Thus, an actual gate voltage applied to the channel region is further reduced.

A dual-gate device or an ultra-thin SOI device can enhance controllability of the gate on the channel region, and thus suppresses the short channel effect.

Another trend is to replace the polysilicon gate with a metal gate, which alleviates an unfavorable effect of polysilicon depletion by using a metal having a good conductivity. In manufacturing such a semiconductor device, a replacement gate process is typically used to precisely control a gate length, which comprises the steps of forming a dummy gate conductor such as polysilicon, selectively removing the dummy gate conductor to provide a gate opening, and finally depositing a gate metal in the gate opening. An MOS device manufactured by the replacement gate process enhances controllability of the gate on the channel region.

However, the above novel devices, such as the dual-gate device, the ultra-thin SOI device, and the MOS device having a metal gate, still use conventional channel materials, which limits maximum values of an output current and an operating frequency, and has no improvement in a power consumption.

SUMMARY OF THE INVENTION

One object of the present invention is to provide an MOSFET having an increased output current, an increased operating speed and a reduced power consumption, and a method for manufacturing the same.

According to one aspect of the present invention, there provides a semiconductor device comprising a semiconductor substrate; a first semiconductor layer on the semiconductor substrate; a second semiconductor layer surrounding the first semiconductor layer; a high k dielectric layer and a gate conductor formed on the first semiconductor layer; source/drain regions formed in the second semiconductor layer, wherein the second semiconductor layer has a slant sidewall in contact with the first semiconductor layer.

According to another aspect of the invention, there provides a method for manufacturing a semiconductor device, comprising:
a) forming a second semiconductor layer on a semiconductor substrate;
b) forming a dummy gate on the second semiconductor layer, and source/drain regions besides the dummy gate;
c) removing the dummy gate to provide a gate opening;
d) selectively removing the portion of the second semiconductor layer exposed in the gate opening by wet etching;
e) epitaxially growing a first semiconductor layer on the semiconductor substrate in the gate opening; and
f) forming a gate dielectric layer and a gate conductor in the gate opening.

In the semiconductor device of the present invention, the slant sidewall of the second semiconductor layer facilitates the epitaxial growth of the first semiconductor layer. Consequently, the first semiconductor layer is of high quality and improves performance of the channel region of the semiconductor device. The first semiconductor layer is made of a high-mobility material, which leads to an increased output current, an increased operation frequency and a reduced power consumption when the first semiconductor layer is used as the channel region. The most suitable materials can be used for the source/drain regions and the channel regions to provide optimal performance respectively.

In a preferred embodiment, the first semiconductor layer is an epitaxial layer which has a top surface and a bottom surface matching {100} plane of Si, and a sidewall in contact with the second semiconductor layer and matching {111} plane of Si. The interface (i. e. sidewall) between the first semiconductor layer and the second semiconductor layer substantially preserves integrity and continuity of a crystal structure, which decreases an amount of defects due to the existence of the interface. The epitaxial growth in this direction can provide a flat surface, which ensures a uniform thickness of the channel region.

In the method of the present invention, a doping process for providing the source/drain regions is performed before formation of the channel region, which avoids a diffusion of dopants towards the channel region and thus decreases an amount of defects in the channel region and improves greatly the performance of the semiconductor device.

DETAILED DESCRIPTION OF PREFERRED EMBODIMENTS

Figure 1:
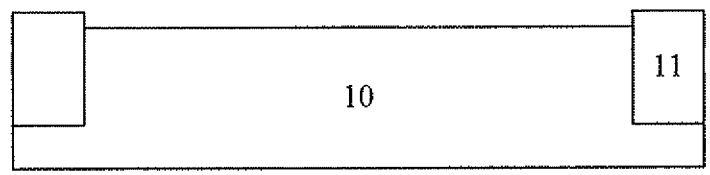
FIGS. 1-15 schematically shows cross-sectional views of a semiconductor device at various stages of the manufacturing method according to the present invention.

Exemplary embodiments of the present invention are described in more details below with reference to the accompanying drawings. In the drawings, like reference numerals denote like members. The figures are not drawn to scale, for the sake of clarity.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

Some particular details of the invention will be described, such as an exemplary structure, material, dimension, process step and fabricating method of the device, for a better understanding of the present invention. Nevertheless, it is understood by one skilled person in the art that these details are not always essential for but can be varied in a specific implementation of the invention Unless the context clearly indicates otherwise, each part of the semiconductor device can be made of material(s) well-known to one skilled person in the art. As an initial structure, a semiconductor substrate can be made of for example a group IV semiconductor (such as Si, Ge) or group III-V semiconductor (such as GaAs, InP, GaN, SiC). A gate conductor can be for example a metal layer, a doped polysilicon layer, or a multilayer gate conductor including a metal layer and a doped polysilicon layer. The metal layer is made of one selected from a group consisting of TaC, TiN, TaTbN, TaErN, TaYbN, TaSiN, HfSiN, MoSiN, $RuTa_x$, $NiTa_x$, $MoN_x$, TiSiN, TiCN, TaAlC, TiAlN, TaN, $PtSi_x$, $Ni_3Si$, Pt, Ru, Ir, Mo, HfRu, $RuO_x$, and their combinations. A gate dielectric layer is made of $SiO_2$ or other dielectric insulation material which has a dielectric constant larger than that of $SiO_2$, such as an oxide, a nitride, an oxynitride, a silicate, an aluminate, and a titanate. The oxide includes for example $SiO_2$, $HfO_2$, $ZrO_2$, $Al_2O_3$, $TiO_2$, $La_2O_3$. The nitride includes for example $Si_3N_4$. The silicate includes for example $HfSiO_x$. The aluminate includes for example $LaAlO_3$. The titanate includes for example $SrTiO_3$. The oxynitride includes for example SiON. Moreover, the gate dielectric can be made of those developed in the future, besides the above known materials.

According to one preferable embodiment according to the present invention, the steps shown in FIGS. 1 to 15 are performed in sequence for manufacturing the MOSFET.

The method for manufacturing the MOSFET according to the present invention starts with a semiconductor substrate 10 having shallow trench isolation (STI) regions 11, as shown in FIG. 1. The semiconductor substrate 10 is preferably a single-crystal silicon substrate. STI regions 11 are preferably made of an oxide for electrically isolating active regions in the semiconductor substrate 10. A surface of the semiconductor substrate 10 is exposed between the STI regions.

Figure 2:
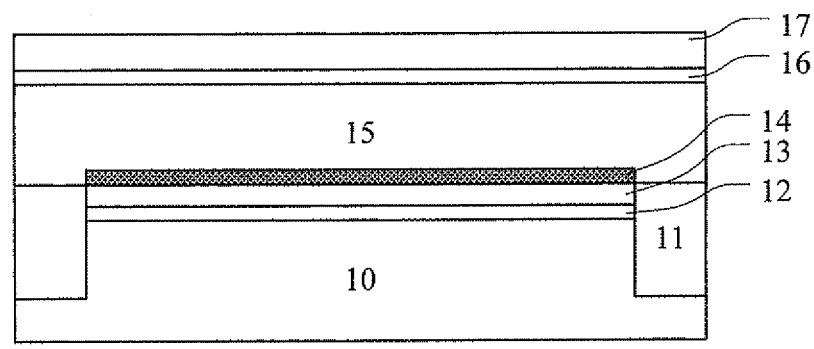

A SiGe layer 12 having a thickness of about 10-20 nm and a Ge content of about 5-15% and a Si layer 13 having a thickness of about 3-10 nm are selectively and epitaxially grown in sequence on the exposed surface of the semiconductor substrate 10 by a conventional deposition process such as PVD, CVD, atomic layer deposition, sputtering, and the like, as shown in FIG. 2.

Due to a selectivity of the epitaxial growth, neither SiGe layer 12 nor Si layer 13 is formed in the STI regions 11.

A portion of the Si layer 13 is then converted into $SiO_2$ by thermal oxidation, to provide a dummy gate dielectric layer 14.

A polysilicon layer 15 having a thickness of about 30-60 nm, an oxide layer 16 having a thickness of about 10-20 nm, and a nitride layer 17 having a thickness of about 20-50 nm are deposited in sequence on the whole surface of the semiconductor structure by the above conventional deposition process. The oxide layer 16 and the nitride layer 17 will be used as a stop layer in an etching process and a protection layer in a chemical mechanical planarization (CMP) process respectively, in subsequent steps.

Figure 3:
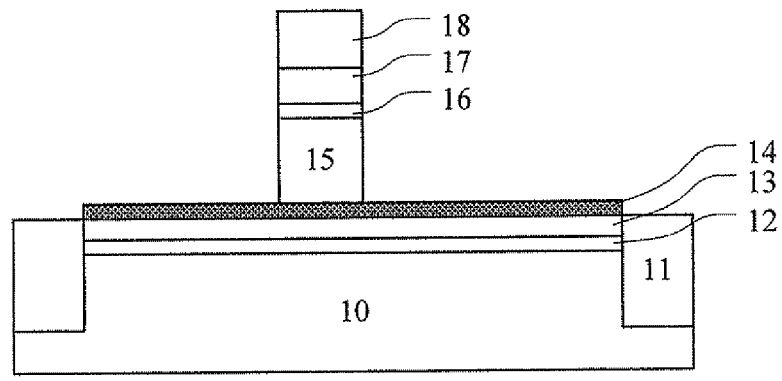

The polysilicon layer 15 is patterned to provide a dummy gate conductor, as shown in FIG. 3.

Firstly, a photoresist layer 18 is formed on a surface of the nitride layer 17, and then patterned by a lithography process including exposure and development, to provide a mask by the photoresist layer 18 having patterns therein. The exposed portions of the nitride layer 17, the oxide layer 16 and the polysilicon layer 15 are removed from top to bottom by a dry etching process, such as ion beam milling, plasma etching, reactive ion etching (RIE), and laser ablation. The etching stops at the top of the dummy gate dielectric layer 14. Finally, the photoresist mask is removed by ashing or dissolution with a solvent.

Figure 4:
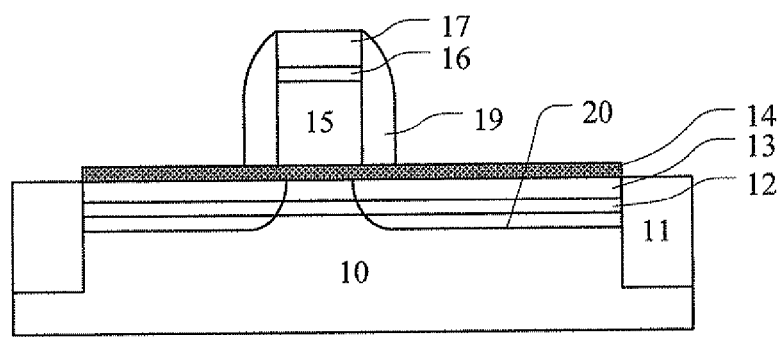

Lightly doped source/drain regions (and extension regions, if required) are formed in the epitaxial Si layer 13, and sidewall spacers are also formed, as shown in FIG. 4.

With a stack of the nitride layer 17, the oxide layer 16 and the dummy gate conductor 15 used as a hard mask, ions are implanted into the epitaxial Si layer 13. For an n-type MOSFET, dopants such as As, P can be used. For a p-type MOSFET, dopants such as B, $BF_2$ can be used.

A nitride layer is then formed on the whole surface of the semiconductor structure by a conventional deposition process. With a photoresist mask (not shown) used, a portion of the nitride layer is etched away by the above dry etching process so that the remaining portion of the nitride layer at both sides of the stack of the nitride layer 17, the oxide layer 16 and the dummy gate conductor 15 forms sidewall spacers 19 of the gate.

If required, the semiconductor structure is subjected to an annealing process, such as a spike anneal at about 1000-1080° C. so as to activate the dopants implanted previously and remedy damages due to the ion implantation. Reference sign 20 in FIG. 4 shows a profile of the source/drain regions.

Figure 5:
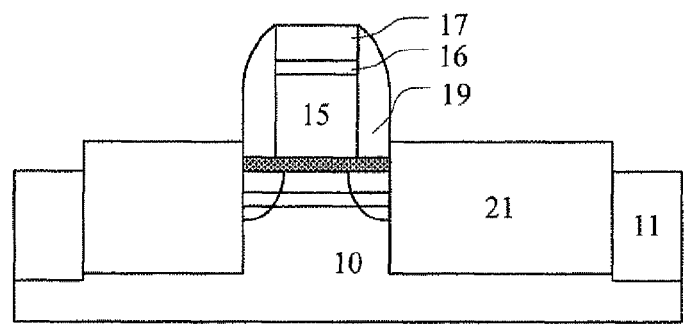

Referring to FIG. 5, with the stack of the nitride layer 17, the oxide layer 16 and the dummy gate conductor 15, the sidewall spacers 19 at both sides of the stack, and the STI regions 11 used as a hard mask, the exposed portions of the dummy gate dielectric layer 14, the epitaxial Si layer 13, the epitaxial SiGe layer 12 and the semiconductor substrate 10 are removed from top to bottom by the above dry etching process. The etching stops at a predetermined depth below a top surface of the semiconductor substrate 10, for example by controlling an etching time.

A SiGe layer having a Ge content of about 20-70% is epitaxially grown on the exposed surface of the semiconductor substrate 10 by the above conventional deposition process, to provide contact regions 21 which electrically and laterally contact the source/drain regions.

Preferably, the contact regions 21 have a thickness so that their top surfaces are above a top surface of the epitaxial Si layer 13, and their bottom surfaces are below a bottom surface of the epitaxial Si layer 13.

Figure 6:
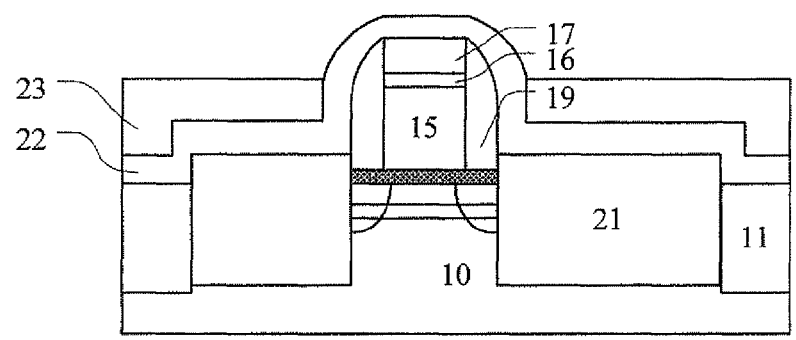

A conformal nitride layer 22 having a thickness of about 10-20 nm and an overlying oxide layer 23 having a thickness of about 100-150 nm are formed on the whole surface of the semiconductor structure by a conventional deposition process, as shown in FIG. 6.

With the nitride layer 22 used as a protection layer, the semiconductor structure is subjected to CMP to provide a flat surface. The CMP removes a portion of the oxide layer 23 so that one portion of the nitride layer 22 above the stack of the nitride layer 17, the oxide layer 16 and the dummy gate conductor 15 is exposed, and the other portion of the nitride layer 22 is below the oxide layer 23.

The oxide layer 23 is then etched back, during which a portion of the oxide layer 23 is selectively removed with respect to the nitride layer. The exposed portion of the nitride layer 22 looks like a nitride cap.

Figure 7:
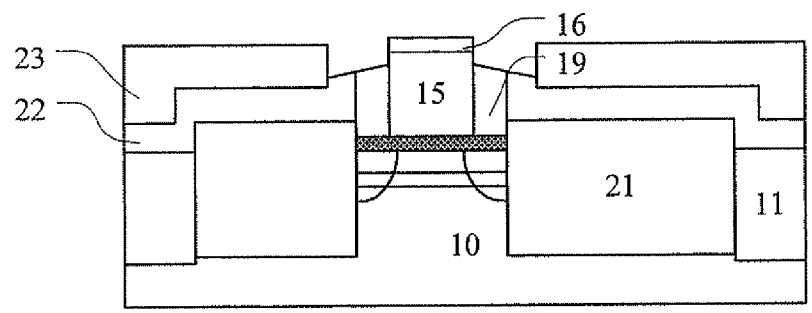

The nitride cap is then selectively removed with respect to the oxide layer by a conventional wet etching process, in which an etching solution is used and the oxide layer 23 serves as a mask for the wet etching, as shown in FIG. 7. The etching firstly removes the exposed portion of the sidewall spacers 19 of the gate and nitride layer 22, and then removes completely the nitride layer 17 at the top of the stack.

Figure 8:
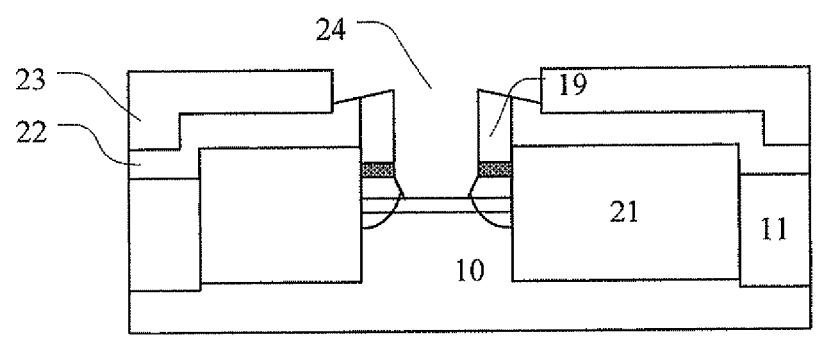

The oxide layer 16 and the polysilicon layer 15 which is a dummy gate conductor are then removed completely by a dry etching process. Further, the exposed portion of the dummy dielectric layer 14 is removed. Consequently, a gate opening 24, which is surrounded by the sidewall spacers 19 of the gate, is formed, as shown in FIG. 8.

Si is then selectively removed with respect to SiGe by a conventional wet etching process, in which an etching solution is used. The etching is anisotropic and thus removes only the portion of the epitaxial Si layer 13 exposed in the gate opening 24, so that a top surface of the epitaxial SiGe layer 12 is exposed at the bottom of the gate opening.

Those anisotropic etchants well known in the field for Si can be used in the present invention, such as KOH, TMAH, EDP, $N_2H_4 \cdot H_2O$, and the like.

Due to erosion of the anisotropic etchants, an etching rate at {111} plane of Si is at least one order of magnitude less than that at other planes. Consequently, a sidewall of the epitaxial Si layer 13, which is exposed in the gate opening 24, is a {111} facet of Si. The sidewall is slant with respect to a surface of the semiconductor substrate.

Alternatively, in a case that the semiconductor substrate 10 and the epitaxial Si layer 13 are made of different semiconductor materials and the semiconductor substrate 10 can be used as an etching stop layer, the semiconductor device according to the present invention will omit the epitaxial SiGe layer 12.

Figure 9:
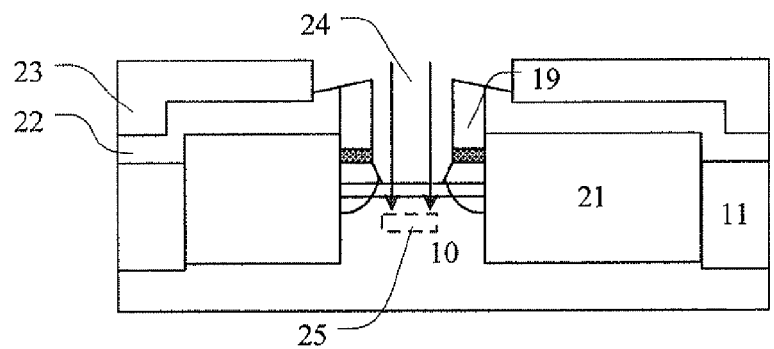

Ions are implanted into the channel region through the gate opening 24, as shown in FIG. 9.

For an n-type MOSFET, dopants can be As or P, with an implantation energy of about 1-20 keV and a doping level of about $2 \times 10^{18}$-$1 \times 10^{20}$/cm$^3$; for a p-type MOSFET, dopants can be B or $BF_2$, with an implantation energy of about 0.2-20 keV and a doping level of about $2 \times 10^{18}$-$1 \times 10^{20}$/cm$^3$.

Preferably, the ion implantation provides a super steep retrograde island (SSRI) 25 is having a rectangular shape below the gate opening 24. As well known in the field, the SSRI has a steep doping profile which reduces the short channel effect. SSRI 25 is located at a depth of about 5-20 nm below the gate opening 24 (i. e. a distance from a bottom of a gate dielectric layer to be formed).

After the ion implantation, the doped channel region may be subjected to a laser anneal to activate the dopants.

U.S. Pat. No. 6,214,65481 owned by Bin Yu discloses the above steps of forming a super steep retrograded channel by using a sacrificial gate (corresponding to the dummy gate in the present application), the disclosure of which is incorporated here by reference.

Figure 10:
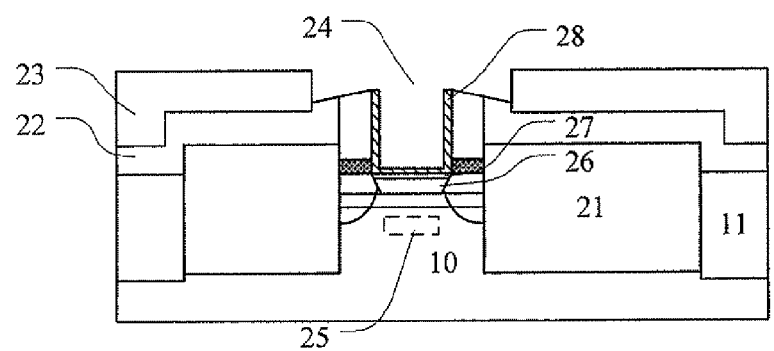

A channel layer 26 having a thickness of about 2-7 nm is epitaxially grown on the epitaxial SiGe layer 12 by the above conventional deposition process, as shown in FIG. 10. A Si layer 27 having a thickness of about 2-5 nm is then epitaxially grown on the channel layer 26, to be converted into a high-quality gate dielectric layer in a subsequent step.

The channel layer 26 replaces a portion of the epitaxial Si layer 13, and is made of a semiconductor material having a mobility of carriers higher than Si. As an example, the channel layer 26 is made of SiGe having a high Ge content (for example, the Ge content is 20-100%). Moreover, the channel layer may be made of a group III-V semiconductor material such as InP, InSb, InGaAs, and InAs.

The channel layer 26 has a crystal structure matching in a vertical direction the underlying epitaxial SiGe layer 12 formed in the step shown in FIG. 2, and in a lateral direction (i.e. at its sidewall) the exposed facet of the epitaxial Si layer 13 formed in the step shown in FIG. 8.

In a preferred embodiment, the channel layer 26 is epitaxially grown on a {110} plane of Si and in a normal direction of the wafer, and on a {111} plane of Si in a lateral direction.

Thus, an interface between the channel layer 26 and the epitaxial Si layer 13 substantially preserves integrity and continuity of a crystal structure, which decreases an amount of defects pinned due to the existence of the interface. Moreover, the epitaxial growth in two directions can provide a flat surface, which ensures a uniform thickness of the channel region.

A portion of the Si layer 27 is then converted into $SiO_2$ by thermal oxidation, to provide a $SiO_2$ layer (not shown) having a thickness of about 0.5-1 nm.

A conformal high k dielectric layer (for example, $HfO_2$) is formed on the whole surface of the semiconductor structure by the above conventional deposition process to have a thickness of about 2-5 nm, which serves as a gate dielectric layer 28 of the final MOSFET.

Figure 11:
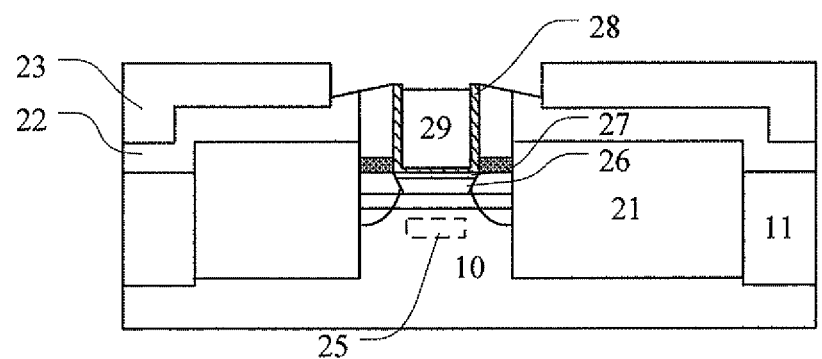

A gate conductor 29 (for example, W, TiN, and other metals) fills the gate opening 24 by the above conventional deposition process, as shown in FIG. 11.

The above step may comprise firstly depositing an overlying metal layer and then patterning the metal layer so that only the portion of the metal layer in the gate opening 24 remains. Preferably, after deposition of the metal layer, the metal layer is etched back so that one portion of the metal layer outside the gate opening 24 is completely removed, and the other portion of the metal layer in the gate opening 24 is partially removed or not removed, by controlling an etching time.

Figure 12:
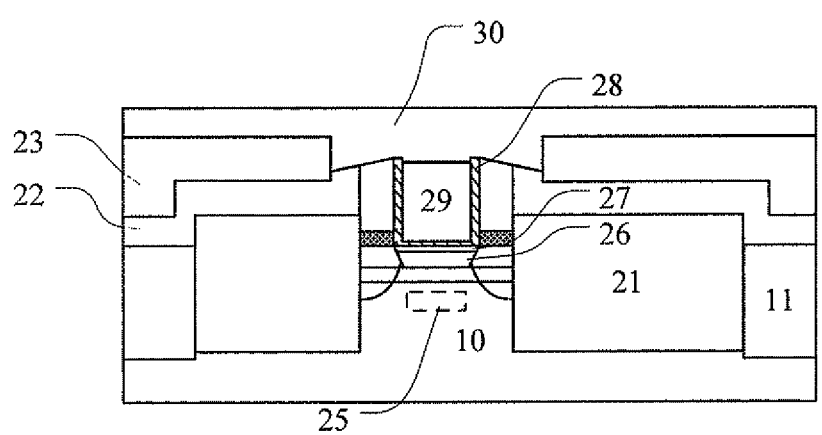

A nitride layer 30 is then formed on the whole surface of the semiconductor structure by the above conventional deposition process and is subjected to CMP so as to provide a flat surface, as shown in FIG. 12. The nitride layer 30 serves as an interlayer dielectric layer (ILD) so that interconnections can be formed on the nitride layer 30.

Figure 13:
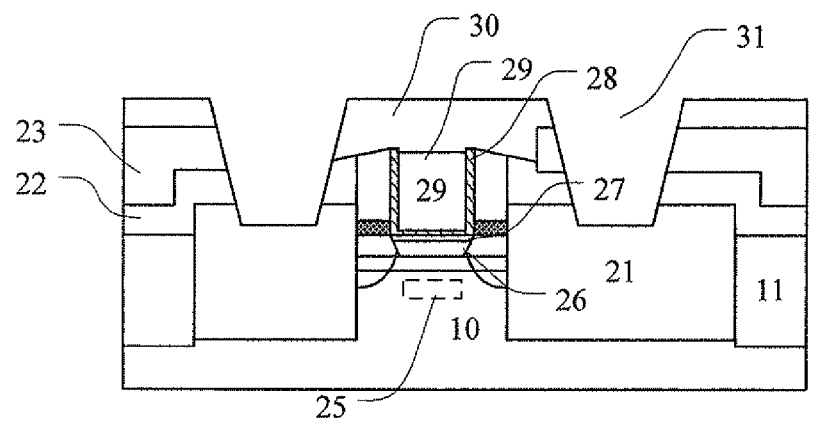

The portions of the nitride layer 30, the oxide layer 23 and the nitride layer 22 above the contact regions 21 is removed from top to bottom by the above dry etching process with a photoresist mask (not shown) used, to provide via holes 31 to the contact regions 21, as shown in FIG. 13.

Figure 14:
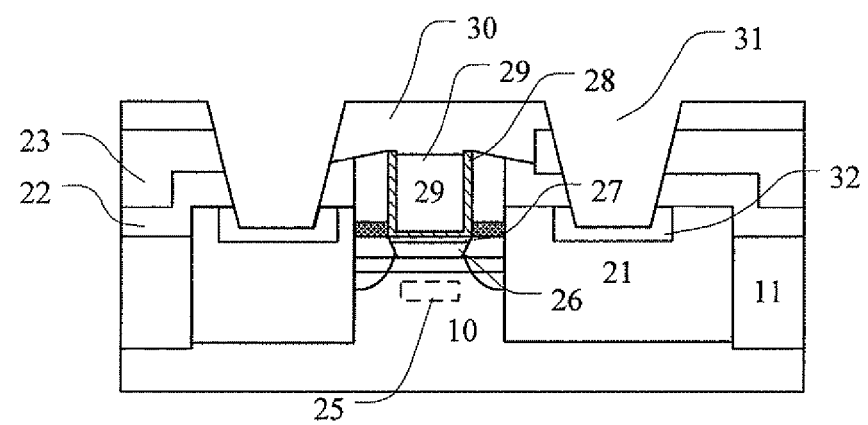

Referring to FIG. 14, silicide regions 32 are formed at a top surface of the contact regions exposed at a bottom of the via holes 32 to reduce a contact resistance between the via conductor to be formed and the contact regions 21.

The above step may comprise firstly depositing a conformal Ni layer on the whole surface of the semiconductor structure, then annealing at about 300-500° C. so that Ni reacts with Si in the contact regions 21 to form a metal silicide, and finally selectively removing unreacted Ni with respect to the metal silicide, for example by wet etching.

Figure 15:
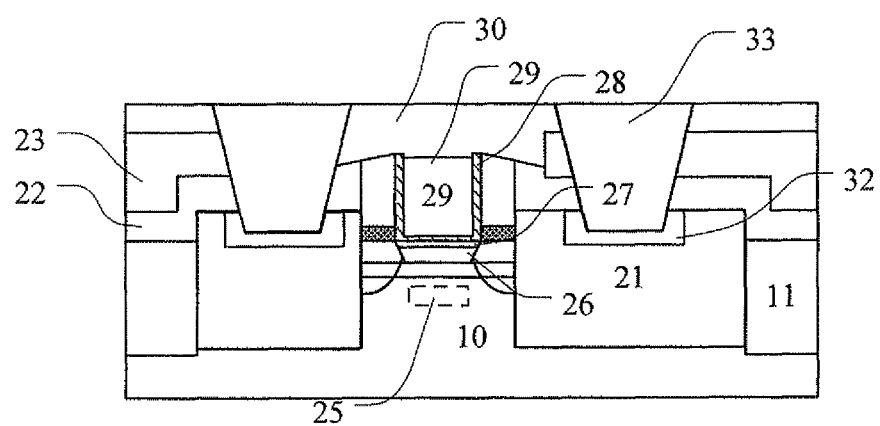

Metal contacts 33 are formed in the via holes 31, as shown in FIG. 15.

The above step may comprise firstly depositing a conformal barrier layer (for example, TiN, not shown) on the whole surface of the semiconductor layer (including an inner wall and a bottom of the via holes 31) by the above conventional deposition process, then depositing a metal layer (for example, W) to fill the via holes 31, and finally removing the portion of the metal layer and the barrier layer outside the via holes 31 by CMP. The remaining portion of the metal layer in the via holes 31 forms metal contacts 33.

While the invention has been described with reference to specific embodiments, the description is illustrative of the invention. The description is not to be considered as limiting the invention. Various modifications and applications may occur for those skilled in the art without departing from the true spirit and scope of the invention as defined by the appended claims.

What is claimed is:

1. A semiconductor device, comprising
a semiconductor substrate;
a first semiconductor layer on the semiconductor substrate, and a second semiconductor layer surrounding the first semiconductor layer;
a gate dielectric layer and a gate conductor formed on the first semiconductor layer; and
source/drain regions formed in the second semiconductor layer,
wherein the second semiconductor layer has a slant sidewall in contact with the first semiconductor layer, and
wherein the first semiconductor layer has a top surface and a bottom surface matching {100} plane of Si, and a sidewall in contact with the second semiconductor layer and matching {111} plane of Si.

2. The semiconductor device according to claim 1, wherein the first semiconductor layer is made of at least one selected from the group consisting of SiGe, InP, InSb, InGaAs, and InAs.

3. The semiconductor device according to claim 2, wherein the first semiconductor layer is made of SiGe with a Ge content of about 20-100%.

4. The semiconductor device according to claim 1, wherein an etching stop layer is sandwiched between the first semiconductor layer and the semiconductor substrate.

5. The semiconductor device according to claim 4, wherein the etching stop layer is made of SiGe.

6. The semiconductor device according to claim 1, wherein a p-type or n-type doped super steep retrograde island is formed below the gate dielectric layer.

7. The semiconductor device according to claim 6, wherein a distance between the super steep retrograde island and a bottom of the gate dielectric layer is about 5-20 nm.

8. The semiconductor device according to claim 1, wherein the source/drain regions are made of doped SiGe.

9. The semiconductor device according to claim 1, wherein the first semiconductor layer has carrier mobility higher than that of the second semiconductor layer.

* * * * *